United States Patent [19]

Kobayashi et al.

[11] Patent Number: 5,309,121

[45] Date of Patent: May 3, 1994

[54] SIGNAL TRANSFER LINE HAVING A DIN CONNECTOR

[75] Inventors: Yuji Kobayashi; Tetsuro Nakata, both of Kanagawa, Japan

[73] Assignee: Sony Corporation, Tokyo, Japan

[21] Appl. No.: 699,493

[22] Filed: May 14, 1991

[30] Foreign Application Priority Data

May 14, 1990 [JP] Japan ............................ 2-50127[U]

[51] Int. Cl.$^5$ .............................................. H01P 5/00
[52] U.S. Cl. .................................... 333/33; 333/246;
333/260; 439/76; 439/638
[58] Field of Search .................. 333/32, 33, 260, 246;
439/76, 638, 639

[56] References Cited

U.S. PATENT DOCUMENTS

| 3,573,704 | 4/1971 | Tarver | 439/76 |
| 4,593,243 | 6/1986 | Lao et al. | 333/33 X |
| 4,993,956 | 2/1991 | Pickles et al. | 439/76 |
| 5,046,955 | 9/1991 | Olsson | 439/76 X |

OTHER PUBLICATIONS

Brown, A. V.; "Fabricating Minature Strip Lines"; IBM Technical Disclosure Bulletin; vol. 12, No. 10; Mar. 10, 1970; pp. 1637-1638.

Primary Examiner—Benny Lee
Attorney, Agent, or Firm—Lewis H. Eslinger; Jay H. Maioli

[57] ABSTRACT

A signal transfer line of electrical equipment which is provided with a BNC connector as the external input-/output connector to which a coaxial cable is connected and which performs transfer of signals between the BNC connector and a circuit board inside the equipment, wherein the BNC connector is mounted to a connector board, a DIN connector is mounted to the board, a line pattern portion connecting the BNC connector and DIN connector being constituted on the board, pins for signals of the DIN connector being comprised with a characteristic impedance the same as the characteristic impedance of the coaxial cable by suitably grounding surrounding pins or by the microstripping of the line pattern portion etc., whereby arrangement of wiring in the electrical equipment becomes unnecessary so that connections for transferring signals can be manufactured at a low cost.

3 Claims, 5 Drawing Sheets

SIGNAL TRANSFER LINE HAVING A DIN CONNECTOR

BACKGROUND OF THE INVENTION

1. Field of the Invention

The present invention relates to a signal transfer line of electrical equipment having a BNC connector as the external input/output connector.

2. Description of the Related Art

When transferring signals between electrical equipment by coaxial cable, a BNC connector is mounted to the electrical equipment. The transfer between the BNC connector and a circuit board in the electrical equipment is generally also performed using a coaxial cable.

However, if a coaxial cable is used, it is necessary to use an additional coaxial connector when the end of the coaxial connector is not connected directly to the electrical component but is connected indirectly. A coaxial cable and coaxial connector are expensive, so manufacturing each signal transfer line becomes high in cost.

Further, if the number of coaxial cables increases, the arrangement of the wiring becomes complicated.

SUMMARY OF THE INVENTION

Therefore, the present invention has as its object the provision of a signal transfer line which enables transfer of signals with transfer characteristics substantially the same as in the case of use of a coaxial cable but without the use of a coaxial cable and which requires no arrangement of wiring at all and, further, can be realized at a low cost.

To achieve the above object, the signal transfer line of the present invention is provided with a BNC connector as an external input/output connector to which a coaxial cable is connected and which performs the signal transfer between the BNC connector and a circuit board in the equipment, wherein the BNC connector is mounted to a connector board, a DIN connector to be connected to the circuit board is mounted to the connector board, the connector board is provided with a line pattern portion connecting between the BNC connector and the DIN connector and comprised with a characteristic impedance which is the same as the characteristic impedance of the coaxial cable, and part of the plurality of pines of the DIN connector are grounded to give the signal pins a characteristic impedance which is characteristic impedance of the coaxial cable.

BRIEF DESCRIPTION OF THE DRAWINGS

The above object and features of the present invention will be more apparent from the following description of the preferred embodiments with reference to the accompanying drawings, wherein:

FIG. 1 to FIG. 8 are views showing an embodiment of the present invention, wherein:

FIG. 1 is a schematic view of one surface of a board,

FIG. 2 is a schematic view of the other surface of the board,

FIG. 3 is a partially enlarged sectional view of a through hole portion of the board, FIG. 4 is a sectional view of a microstrip line, FIG. 5 is a graph showing the relationship of the width of the signal pattern portion and the characteristic impedance value, FIG. 6 is a view showing the grounding state of the pins of the DIN connector, and FIG. 7 is a sectional view of a switcher.

FIG. 8 is a sectional view of a strip line

DESCRIPTION OF THE PREFERRED EMBODIMENTS

The gist of the present invention is as follows: A signal led from a coaxial cable is board in the inside, while a signal from a circuit board is led by the reverse path to a coaxial cable. The line pattern portion and DIN connector have the same characteristic impedance as the characteristic impedance of the coaxial cable, so signals can be transferred by substantially the same transfer characteristics as when using a coaxial cable. Since no coaxial cable is used, there is no need for arrangement of the wiring and since the signal transfer line is comprised of a connector pattern formed on a board and a DIN connector, the cost of manufacture can be lowered.

Below, an embodiment of the invention will be described in detail using the drawings.

Figure 7:
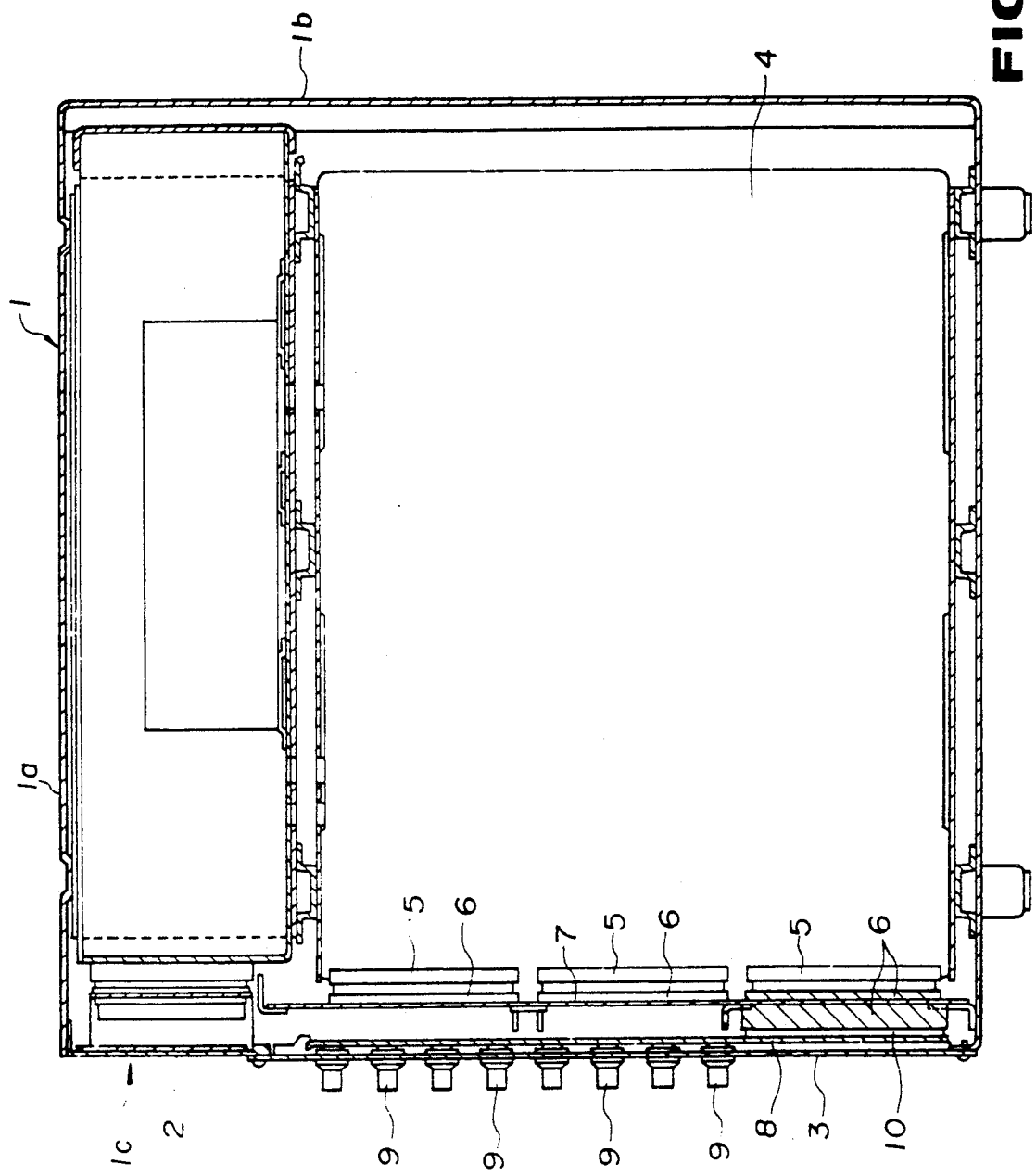
Figure 8:
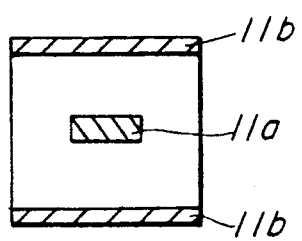

FIG. 1 to FIG. 8 show an embodiment of the present invention. In the embodiment, the case is shown of use for a signal transfer line of a switcher with numerous input/output channels. The switcher leads an input digital video signal selectively to the desired external terminal side and is provided with a serial interface to which signals are sent by coaxial cable in addition to a parallel interface. FIG. 7 is a sectional view of the switcher showing this location.

In FIG. 7, a case 1 has a rectangular shape. The case 1 is comprised of a case body 1a and a front panel 1b and rear panel 1c. The front panel 1b is provided rotatably on the case body 1a and opens the case 1 when in the open position. The rear panel 1c is comprised of a top panel member 2 and a plurality of bottom panel members 3 provided in parallel therewith. In the case 1 are housed a plurality of circuit boards 4 slidably mounted at certain intervals. The circuit boards 4 can be exchanged from the front panel 1b. At the rear insertion portion of the circuit boards 4 are mounted DIN connectors 5 at three locations. One DIN connector 5 is connected with another DIN connector 6. In the depth of the case 1 is arranged a mother board 7 at a position perpendicular to the circuit boards 4. The mother board 7 is provided with the above-mentioned other DIN connectors 6.

On the other hand, a board 8 is mounted at the inner side of part of the plurality of bottom panel members 3. At one surface of the board 8 forming the outside of the case 1 is mounted sixteen BNC connectors 9. At the bottom panel members 3 are formed insertion holes for insertion of the BNC connectors 9 (not shown). The BNC connectors 9 have connected to them BNC connectors provided at ends of coaxial cables. Input and output of signals are performed through the BNC connectors 9. Further, the other surface of the board 8 forming the inside of the case 1 has mounted to it other DIN connectors 10. The other DIN connectors 10 are each connected to one of the other DIN connectors 6 mounted to the mother board 7. The other DIN connectors 6 have pin insertion portions projecting outward in two directions and can be connected to the opposing DIN connectors 10 and 5 from both sides. Signals sent in through the board 8 from the outside to the circuit boards 4 and signals sent from the circuit boards 4 through the board 8 to the outside are transferred through the DIN connectors 5, 6, and 10. The circuit boards 4 have mounted to them serial/parallel conversion IC's and parallel/serial conversion IC's, so serial signals sent in through the DIN connectors 10 are led to the serial/parallel conversion IC's and the output of the parallel/serial conversion IC is sent conversely through the DIN connectors 10. The signal transfer between the circuit boards 4 is performed through the other two DIN connectors 5 of the mother board 7.

Figure 1:
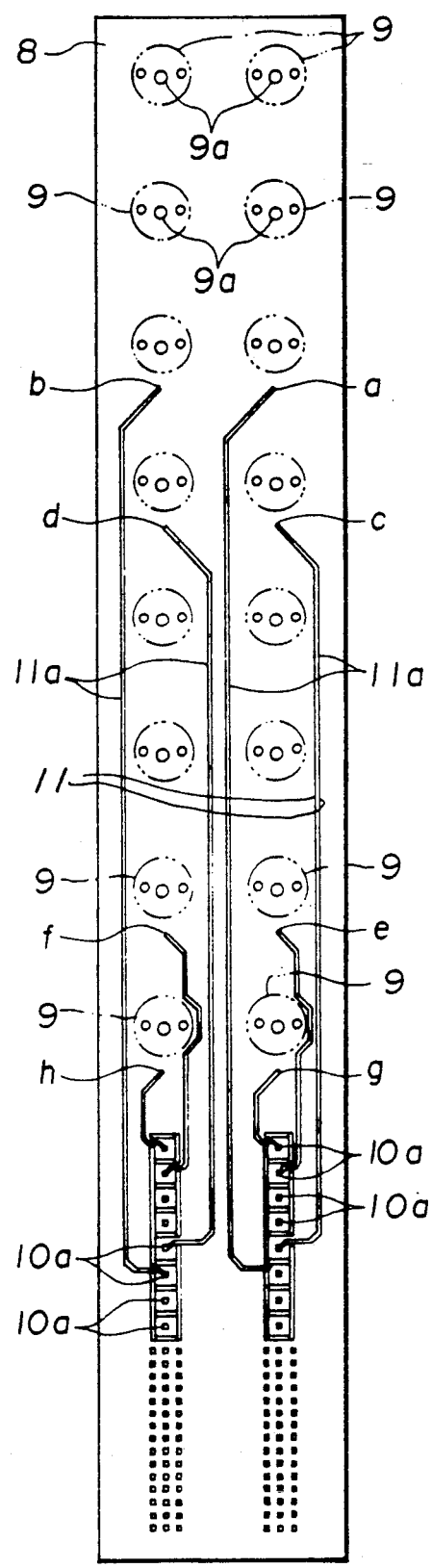
Figure 2:
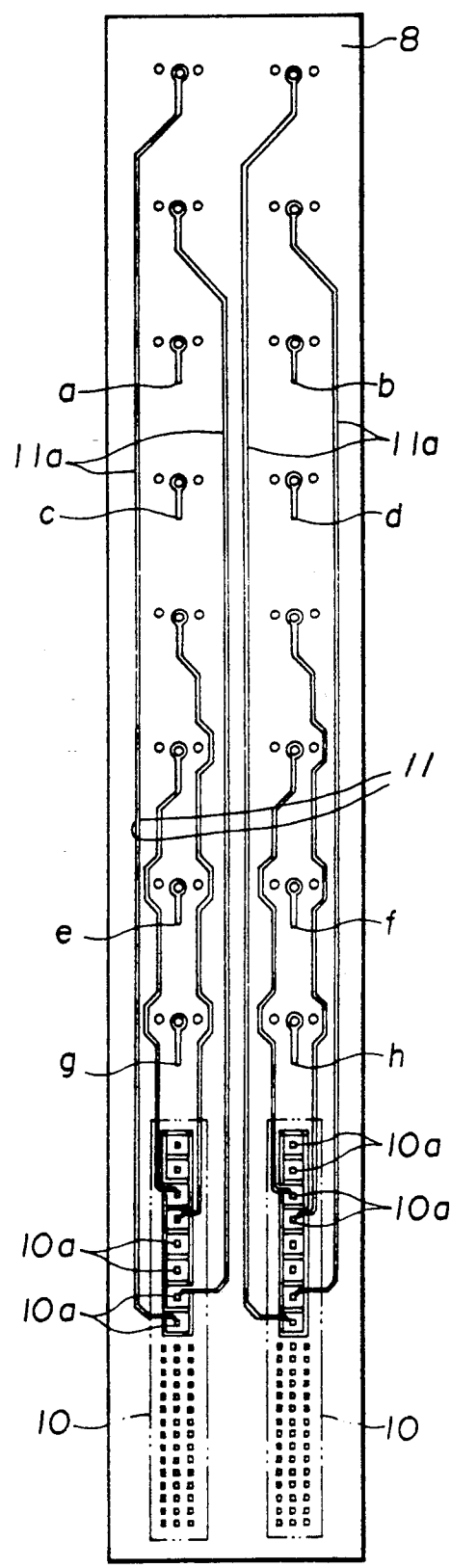
Figure 3:
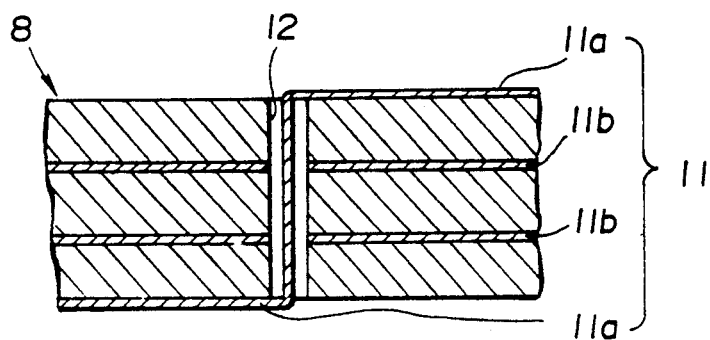
Figure 4:
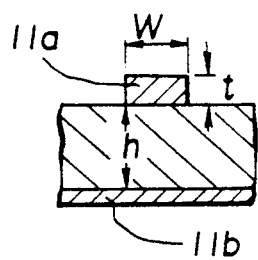

FIG. 1 and FIG. 2 show outlines of the signal pattern portions 11a of the surfaces of the board 8. Between the center pins 9a of the BNC connectors 9 (see FIG. 1) and the signal pins 10a of the DIN connectors 10 are connected sixteen signal patterns 11a. Eight of the signal patterns 11a are formed completely on the other surface, while the other eight are connected at the side of the BNC connector 9 as the other surface, but then are changed to the opposing surface partway between the center pins 9a and the signal pins 10a. The portions shown by the characters a to h in FIG. 1 and FIG. 2 are respectively connected. These portions are shown in FIG. 3. In FIG. 3, through holes 12 are formed in the board 8, by which through holes 12 are connected the signal patterns 11a of the two surfaces by passing the signal patterns 11a therethrough. Further, in the board 8 are provided ground patterns 11b at two locations as shown in FIG. 3. Microstrip lines are formed in the line pattern portion 11 of the board 8 so that the line pattern portion 11 has the same characteristic impedance as the coaxial line. In FIG. 4, if the width of the signal patterns 11a is W and the thickness is t and if the distance between the signal patterns 11a and the ground patterns 11b is h, then the characteristic impedance Z is found by:

$$Z = 87/E_r + 1.41 \ln (5.98h/0.8W + t)$$

where $E_r$ is the relative inductance rate of the board and $t < < W$.

Figure 5:
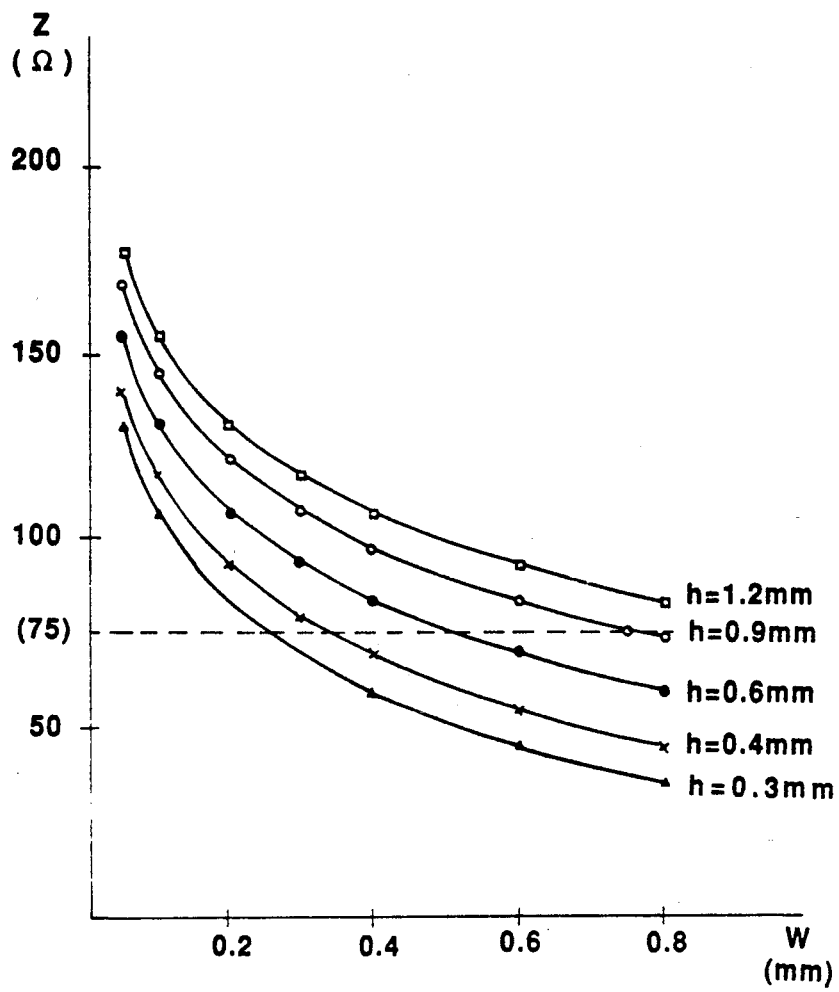
Figure 6:
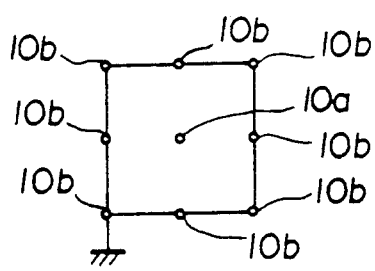

This being the case, the graph shown in FIG. 5 is obtained and, for example, in the case where the characteristic impedance of the coaxial line is 75 ohms, by determining W and h to the values shown at the intersection with the broken line, it is possible to prepare the line pattern portion 11 with a characteristic impedance of 75 ohms. Further, in this embodiment, the line pattern portion 11 was comprised of microstrip lines, but it may also be comprised by strip lines (see FIG. 8), etc.

The DIN connectors 10 of the board 8 have three rows of pins provided in parallel. The pins surrounding the signal pins 10a are suitably grounded, whereby the signal pins 10a are made to have the same characteristic impedance as the characteristic impedance of the coaxial cable. In this embodiment, as show in FIG. 6, the pins 10b around the signal pins 10a are grounded so as to obtain the same characteristic impedance as the characteristic impedance of the coaxial cable.

In the above construction, the serial digital signal led from the coaxial cable is sent to the serial/parallel conversion IC of the circuit board 4 through the BNC connectors 9, the signal pattern portions 11a of the board 8, and the three DIN connectors 10, 6, and 5. Further, the output of the parallel/serial conversion IC is sent to the coaxial cable by the reverse route. During this signal transfer, since the line pattern portion 11 and the DIN connectors 10 are made to have the same characteristic impedance as the characteristic impedance of the coaxial cable, the signal is transferred by the same transfer characteristic as with the use of a coaxial cable. Further, since no coaxial cable is used for arrangement of the signal in the equipment, there is no need for complicated arrangement of the wiring and further the system may be manufactured at a low cost.

In this embodiment, further, the DIN connectors 5 of the circuit boards 4, the serial/parallel conversion IC, or the parallel/serial conversion IC are connected by a usual conductor pattern, but microstrip lines etc. may be used to comprise a line pattern portion having the same characteristic impedance as the characteristic impedance of the coaxial cable. If the DIN connectors 5, like the DIN connectors 10, have pins grounded to make the signal pins have the same characteristic impedance as the characteristic impedance of the coaxial cable, the signal transfer characteristic may be further improved.

As mentioned above, according to the present invention, there is provided a signal transfer line of electrical equipment which is provided with a BNC connector as the external input/output connector to which a coaxial cable is connected and which performs transfer of signals between the BNC connector and a circuit board inside the equipment, wherein the BNC connector is mounted to the connector board, which board has mounted to it a DIN connector, a line pattern portion connecting the connector BNC connector and DIN connector being constituted on the board, pins for signals of the DIN connector being comprised with a characteristic impedance which is the same as the characteristic impedance of the coaxial cable by suitably grounding surrounding pins or microstrip lines of the line pattern portion etc., whereby arrangement of wiring in the electrical equipment becomes unnecessary and signals can be transferred in a system manufactured at a low cost.

We claim:

1. A signal transfer line for performing signal transfer between a coaxial cable having a characteristic impedance and a circuit board in an electrical equipment, said signal transfer line comprising:
    a connector board;
    a DIN connector mounted to said connector board and comprising a plurality of pins including at least one signal pin;
    a BNC connector mounted to said connector board and including a signal pin;
    a conductive line pattern portion disposed on said connector board and electrically connecting the signal pin of said BNC connector and the signal pin of said DIN connector;
    said conductive line pattern portion having a characteristic impedance which matches said characteristic impedance of said coaxial cable, and said DIN connector having a characteristic impedance which matches said characteristic impedance of said coaxial cable electrically connecting at least one pin of said plurality of pins of said DIN connector to electrical ground.

2. A signal transfer line as set forth in claim 1, wherein said line pattern portion comprises at least one microstrip line having said characteristic impedance of said coaxial cable.

3. A signal transfer line as set forth in claim 1, wherein said line pattern portion comprises at least one strip line having said characteristic impedance of said coaxial cable.

* * * * *

UNITED STATES PATENT AND TRADEMARK OFFICE
CERTIFICATE OF CORRECTION

PATENT NO. : 5,309,121
DATED : May 3, 1994
INVENTOR(S) : Yuji Kobayashi and Tetsuro Nakata It is certified that error appears in the above-indentified patent and that said Letters Patent is hereby corrected as shown below:

```
Col. 1, line 46, change "pines" to --pins--
Col. 2, Line 7, after "is" insert --led through a line
        pattern portion of the board and a DIN connector
        to a circuit--
Col. 4, line 7, after "lines" insert --,--
```

In the Claims:
Col. 4, line 55, after "cable" insert --by--

Signed and Sealed this

Thirtieth Day of May, 1995

Attest:

BRUCE LEHMAN

Attesting Officer     Commissioner of Patents and Trademarks